(12) United States Patent
Nishino et al.

(10) Patent No.: US 8,178,191 B2
(45) Date of Patent: May 15, 2012

(54) MULTILAYER WIRING BOARD AND METHOD OF MAKING THE SAME

(75) Inventors: Shigeo Nishino, Hitachi (JP); Hiroyuki Takasaka, Hitachi (JP); Nagayoshi Matsuo, Hitachi (JP); Hiroyuki Okabe, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 951 days.

(21) Appl. No.: 12/138,779

(22) Filed: Jun. 13, 2008

(65) Prior Publication Data

US 2009/0151990 A1    Jun. 18, 2009

(30) Foreign Application Priority Data

Jun. 14, 2007    (JP) ................... 2007-157787

(51) Int. Cl.
*H05K 1/00* (2006.01)
*H05K 1/02* (2006.01)

(52) U.S. Cl. ........ 428/209; 174/258; 174/259; 361/746; 428/901

(58) Field of Classification Search .............. 428/209, 428/901; 174/250–259; 361/746
See application file for complete search history.

(56) References Cited

U.S. PATENT DOCUMENTS

| | | | |
|---|---|---|---|
| 5,719,354 A | 2/1998 | Jester et al. | |
| 6,326,555 B1 * | 12/2001 | McCormack et al. | 174/255 |
| 6,602,583 B2 * | 8/2003 | St. Lawrence et al. | 428/209 |
| 7,227,179 B2 * | 6/2007 | St. Lawrence et al. | 257/40 |
| 7,238,603 B2 * | 7/2007 | Iijima et al. | 438/613 |
| 7,312,400 B2 * | 12/2007 | Ito et al. | 174/250 |
| 7,755,183 B2 | 7/2010 | Yamamoto | |
| 7,805,834 B2 | 10/2010 | White et al. | |
| 2004/0040651 A1 | 3/2004 | Tsugaru et al. | |
| 2009/0020319 A1 | 1/2009 | Yamada | |
| 2009/0107624 A1 | 4/2009 | Tsugaru et al. | |

FOREIGN PATENT DOCUMENTS

| | | |
|---|---|---|
| CN | 1489431 A | 4/2004 |
| JP | 08-097565 A | 4/1996 |
| JP | 2000-208946 A | 7/2000 |
| JP | 2002-353619 A | 12/2002 |
| JP | 2003-347738 A | 12/2003 |
| JP | 2003-347747 A | 12/2003 |
| JP | 2004-111942 A | 4/2004 |

(Continued)

OTHER PUBLICATIONS

Translation of JP 2003-347738 A.

(Continued)

*Primary Examiner* — Cathy Lam
(74) *Attorney, Agent, or Firm* — Foley & Lardner LLP (57) ABSTRACT

A multilayer wiring board includes a core insulating layer with a first conductive wiring, a first insulating layer with a softening temperature lower than the core insulating layer, and a second insulating layer formed on the core insulating layer through the first insulating layer, the second insulating layer with a second conductive wiring electrically connected to the first conductive wiring and a softening temperature higher than the first insulating layer. The first insulating layer is mainly formed of a liquid crystal polymer. The core insulating layer and the second insulating layer are mainly formed of a polyimide resin or a bismaleimide triazine resin. The first conductive wiring and the second conductive wiring are electrically connected through a conductive via formed penetrating through the first insulating layer and the second insulating layer in a thickness direction.

5 Claims, 7 Drawing Sheets

FOREIGN PATENT DOCUMENTS

| | | |
|---|---|---|
| JP | 2005-072187 A | 3/2005 |
| JP | 2006-228922 A | 8/2006 |
| JP | 2006-521708 A | 9/2006 |
| JP | 2007-227420 A | 9/2007 |
| KR | 2004-19911 A | 3/2004 |
| KR | 10-2006-0092087 A | 8/2006 |
| KR | 10-0620631 B1 | 9/2006 |
| TW | 2006-38832 | 1/1995 |
| WO | WO 2006/078027 A1 | 7/2006 |

OTHER PUBLICATIONS

Translation of JP 2000-208946 A.

* cited by examiner

FIG.3A  13 MULTILAYER WIRING BOARD

160a GOLD LAYER  150c  155b  170a SOLDER RESIST
155a WIRING PATTERN  131a EXTERNAL INSULATING LAYER
150a VIA PATTERN  140a ADHESION LAYER
155d  100 CORE INSULATING LAYER
140b
131b
170b
160b  155e  150d

FIG.3B  14 MULTILAYER WIRING BOARD 160a  150c  155b  170a
155a  132a EXTERNAL INSULATING LAYER
150a  101 CORE INSULATING LAYER
155d  132b
170b
160b  155e  150d

MULTILAYER WIRING BOARD AND METHOD OF MAKING THE SAME

The present application is based on Japanese Patent Application No. 2007-157787 filed on Jun. 14, 2007, the entire contents of which are incorporated herein by reference.

BACKGROUND OF THE INVENTION

1. Field of the Invention

The present invention relates to a multilayer wiring board and a method of making the same.

2. Related Art

JP-A-2003-347738 discloses a multilayer wiring board in which an insulating layer formed of a liquid crystal polymer while having a conductive composition filled in a via hole formed in a predetermined region and a conductor layer formed of a patterned conductive material are alternately laminated, wherein the number of the conductive composition coaxially formed in a laminate direction between the insulating layer and the conductor layer is limited and the conductive composition over this lamination is formed at a position not overlapping with the one formed coaxially.

According to the multilayer wiring board disclosed by JP-A-2003-347738, when laminating the insulating layer and the conductor layer, if the coaxially formed conductive composition is over a predetermined limited number and if the conductive composition is further formed, it is formed at a position not overlapping with the one already formed coaxially. Therefore, even when the pressure is applied on the laminated insulating layer and the conductor layer, it is possible to ensure the reliability of interlayer connection since it is possible to prevent the application of excessive pressure to the coaxially disposed conductive composition.

Furthermore, JP-A-2000-208946 discloses a multilayer wiring board comprising an insulating layer, a wiring board preliminarily having wiring patterns on both sides of an interlayer insulating layer formed of a liquid crystal polymer and provided on the insulating layer, and an interlayer connection part penetrating in a thickness direction of the insulating layer and connecting between the wiring patterns of the wiring board.

According to the multilayer wiring board disclosed by JP-A-2000-208946, since the insulating layer and the wiring board are jointed and integrated without using an adhesive agent but using a liquid crystal polymer, it is possible to clear the environmental problem caused by an existence of adhesive agent containing a flame retardant.

However, in the multilayer wiring board according to JP-A-2003-347738, plural insulating layers are formed of the same liquid crystal polymer, it takes thus long time for a heat treatment process to adhere by laminating one insulating layer and another insulating layer. Furthermore, in the multilayer wiring board according to JP-A-2000-208946, since the wiring board and the insulating layer are integrated in the state that a wiring pattern is preliminarily formed on the wiring board, the bond strength in the region where the wiring pattern is preliminarily formed may not be enough.

THE SUMMARY OF THE INVENTION

Therefore, it is an object of the invention to provide a multilayer wiring board and a method of making the same, which can be formed in a short time and has good heat resistance and a low water-absorbing ratio.

(1) According to one embodiment of the invention, a multilayer wiring board comprises:

a core insulating layer comprising a first conductive wiring, a first insulating layer comprising a softening temperature lower than the core insulating layer; and a second insulating layer formed on the core insulating layer through the first insulating layer, the second insulating layer comprising a second conductive wiring electrically connected to the first conductive wiring and a softening temperature higher than the first insulating layer.

In the above embodiment (1), the following modifications and changes can be made.

(i) The first insulating layer comprises a liquid crystal polymer.

(ii) The core insulating layer and the second insulating layer comprise a polyimide resin or a bismaleimide triazine resin.

(iii) The first conductive wiring and the second conductive wiring are electrically connected through a conductive via formed penetrating through the first insulating layer and the second insulating layer in a thickness direction.

(iv) The multilayer wiring board further comprises:

an outmost insulating layer formed on the second insulating layer opposite the first insulating layer, the outmost insulating layer comprising a liquid crystal polymer.

(2) According to another embodiment of the invention, a method of making a multilayer wiring board comprises:

forming a laminate plate composed of a first insulating layer, a second insulating layer comprising a softening temperature higher than the first insulating layer and a conductive layer arranged in this order, forming a core insulating layer that comprises an insulating material layer comprising a softening temperature higher than the first insulating layer and a conductive wiring formed on a surface of the insulating material layer, forming a composite substrate by contacting a surface of the laminate plate on a side of the first insulating layer with a surface of the core insulating layer, and bonding the laminate plate and the core insulating layer together while applying heat and pressure thereto, forming a through-hole for exposing the conductive wiring on the core insulating layer by penetrating the conductive layer through the first insulating layer of the composite substrate; and filling a conductive material in the through-hole for electrically connecting the conductive wiring and the conductive layer.

In the above embodiment (2), the following modifications and changes can be made.

(v) The first insulating layer comprises a liquid crystal polymer.

(vi) the core insulating layer and the second insulating layer comprise a polyimide resin or a bismaleimide triazine resin.

BRIEF DESCRIPTION OF THE DRAWINGS

Next, the present invention will be explained in more detail in conjunction with appended drawings, wherein.

DESCRIPTION OF THE PREFERRED EMBODIMENTS

Figure 1:
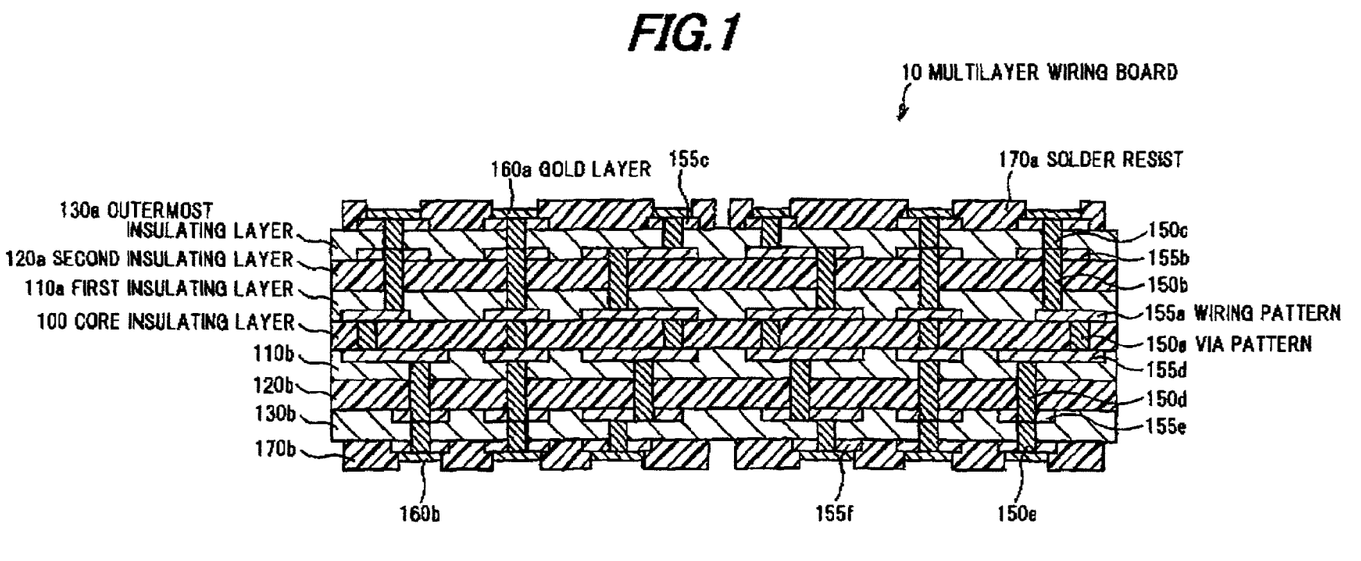
FIG. 1 is a longitudinal sectional view showing a multilayer wiring board in a preferred embodiment of the invention.

FIG. 1 is a longitudinal sectional view of a multilayer wiring board in the preferred embodiment according to the present invention.

Structure of the Multilayer Wiring Board

A multilayer wiring board 10 in this embodiment comprises a core insulating layer 100 having a wiring pattern 155a as a first electrically conductive wiring on the surface, a first insulating layer 110a formed on the wiring pattern 155a and the core insulating layer 100, a second insulating layer 120a formed on the first insulating layer 110a, a wiring pattern 155b formed on the second insulating layer 120a, and an outmost insulating layer 130a formed on the wiring pattern 155b and the second insulating layer 120a.

Furthermore, the core insulating layer 100 further comprises a wiring pattern 155d as a second electrically conductive wiring on the surface opposite to the surface where the wiring pattern 155a is formed. And the multilayer wiring board 10 further comprises a first insulating layer 110b formed on the surface opposite to the surface having the wiring pattern 155a of the core insulating layer 100 and on the wiring pattern 155d, a second insulating layer 120b formed on the surface opposite to the surface which contacts with the core insulating layer 100 of the first insulating layer 110b, a wiring pattern 155e formed on the second insulating layer 120b, and an outmost insulating layer 130b formed on the wiring pattern 155e and the second insulating layer 120b.

Furthermore, the multilayer wiring board 10 comprises a wiring pattern 155c formed on the outmost insulating layer 130a and a wiring pattern 155f formed on the outmost insulating layer 130b, solder resists 170a and 170b formed on the outmost insulating layers 130a and 130b covering the periphery of the wiring patterns 155c and 155f, and gold layers 160a and 160b formed in a region not covered by the solder resists 170a and 170b on the wiring patterns 155c and 155f.

Furthermore, the wiring pattern 155a of the core insulating layer 100 and the wiring pattern 155b formed on the second insulating layer 120a are electrically connected by a via pattern 150b as an electrically conductive via formed penetrating through the first insulating layer 110a and the second insulating layer 120a. Furthermore, the wiring pattern 155b formed on the second insulating layer 120a and the via pattern 150b are electrically connected by a via pattern 150c formed penetrating through the outmost insulating layer 130a to the wiring pattern 155c formed on the outmost insulating layer 130a.

In the same way, the wiring patterns 155d and 155e are electrically connected by a via pattern 150d formed penetrating through the first insulating layer 110b and the second insulating layer 120b. Furthermore, the wiring pattern 155e and the via pattern 150d are electrically connected by a via pattern 150e formed penetrating through the outmost insulating layer 130b to the wiring pattern 155f formed on the outmost insulating layer 130b.

The core insulating layer 100 in this embodiment has a substantially square shape from top view and is formed with the thickness in range from 25 μm to 100 μm. The core insulating layer 100 is formed of a thermosetting resin material which shows an electrical insulation property. The core insulating layer 100 can be formed of a resin with a high heat resistance property, for example, a polyimide resin or a bismaleimide triazine resin of which glass transition temperature as a softening temperature is 300° C. or more.

As the bismaleimide triazine resin, for example, BT resin produced by Mitsubishi Gas Chemical Company, Inc. can be used. When using the BT resin for the core insulating layer 100, for the purpose of improving dimensional stability, it is possible to contain an add-in material, such as a glass cloth, in the BT resin. Meanwhile, when aiming to give flexibility to the core insulating layer 100, it is possible to use a polyimide resin having excellent flexibility, electrical characteristics and mechanical characteristics for the core insulating layer 100.

The wiring patterns 155a and 155d each formed on one surface and another surface of the core insulating layer 100 are formed of a conductive metal material. For example, it is possible to form the wiring patterns 155a and 155d by metal foil such as copper, gold, aluminum or the like. For example, wiring patterns 155a and 155d are each formed with copper foil. It is also possible to form the wiring patterns 155a and 155d by a conductive paste formed in a predetermined shape.

Furthermore, the wiring patterns 155a and 155d are electrically connected by the via pattern 150a formed penetrating through the core insulating layer 100. Here, it is possible to form the via pattern 150a by a process such as copper plating or the like to a via hole which is provided at a predetermined position of the core insulating layer 100 by laser processing or drilling.

The first insulating layers 110a and 110b each have a substantially square shape from top view and are formed with the thickness in range from 25 μm to 100 μm. In this embodiment, it is possible to form the first insulating layers 110a and 110b by a thermoplastic liquid crystal polymer of which liquid crystal transition temperature as a softening temperature is 260° C. For example, it is possible to use an aromatic polyester resin for a liquid crystal polymer.

Here, a material to form the first insulating layers 110a and 110b is selected so that the softening temperature of the first insulating layers 110a and 110b is to be lower than that of the core insulating layer 100. Furthermore, the water-absorbing ratio of the material to form the first insulating layers 110a and 110b is desirably lower than that of the material to form the core insulating layer 100.

The second insulating layers 120a and 120b each have a substantially square shape from top view and are formed with the thickness in range from 25 μm to 100 μm. In this embodiment, the second insulating layers 120a and 120b are each formed of a similar material to the core insulating layer 100. Therefore, the second insulating layers 120a and 120b have a softening temperature higher than that of the first insulating layers 110a and 110b.

Furthermore, the outmost insulating layers 130a and 130b have a substantially square shape from top view and are formed with the thickness in range from 25 μm to 100 μm. In this embodiment, the outmost insulating layers 130a and 130b are each formed of a similar material to the first insulating layers 110a and 110b.

The solder resists 170a and 170b are formed along the outer edge of the wiring patterns 155c and 155f formed on the outmost insulating layers 130a and 130b, respectively. The solder resists 170a and 170b ensure electrical insulation properties between the wiring patterns 155c and the wiring patterns 155f formed on the outmost insulating layers 130a and 130b, respectively.

The gold layers 160a and 160b are provided in the region where the solder resists 170a and 170b on the wiring patterns 155c and the wiring patterns 155f are not formed. It is possible to form the gold layers 160a and 160b, for example, by gold plating. It is also possible to form the gold layers 160a and 160b by other materials having electrical conductivity, for example, copper, aluminum or conductive paste.

Here, it is possible to form the conductive paste by mixing a conductive material such as gold, silver, copper, solder or the like, or, an alloy material containing gold, silver, copper, solder or the like, with a binder formed by a resin. For example, it is possible to use a thermoplastic resin such as a polycarbonate resin or a polyester resin for the binder. Furthermore, it is also possible to use a thermosetting resin such as an epoxy resin or a polyimide resin for the binder.

The wiring patterns 155b and 155e formed on the surface of the second insulating layers 120a and 120b and the wiring patterns 155c and 155f formed on the surface of the outmost insulating layers 130a and 130b are also formed by the similar material to the wiring patterns 155a and 155d.

Furthermore, the wiring patterns 155a and 155b are electrically connected by the via pattern 150b formed penetrating through the first insulating layer 110a and the second insulating layer 120a. In the same way, the wiring patterns 155d and 155e are electrically connected by the via pattern 150d formed penetrating through the first insulating layer 110b and the second insulating layer 120b.

Furthermore, the wiring pattern 155b and the via pattern 150b are electrically connected to the wiring pattern 155c formed on the surface of the outmost insulating layer 130a by the via pattern 150c formed penetrating through the outmost insulating layer 130a. In the same way, the wiring pattern 155e and the via pattern 150d are electrically connected to the wiring pattern 150f formed on the surface of the outmost insulating layer 130b by the via pattern 150e formed penetrating through the outmost insulating layer 130b. It is possible to form the via patterns 150b, 150c, 150d and 150e by the same process to form the via patterns 150a using a similar material to the via pattern 150a.

Method of Making Multilayer Wiring Board

FIGS. 2A to 2J show a process of making the multilayer wiring board in the embodiment according to the present invention.

Figure 2A:
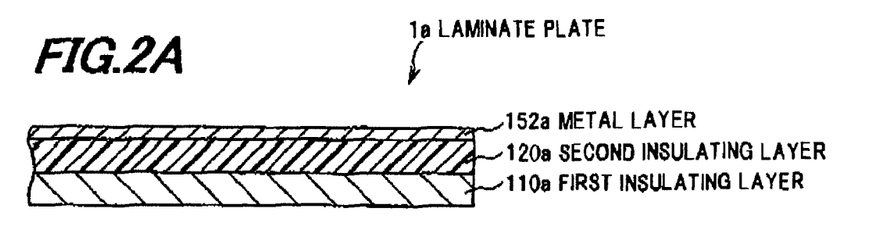
FIG. 2A is a longitudinal sectional view showing a laminate plate in the embodiment.
Figure 2B:
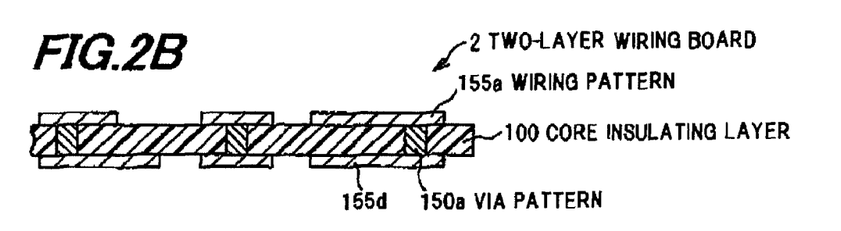
FIG. 2B is a longitudinal sectional view showing a two-layer wiring board in the embodiment.
Figure 2C:
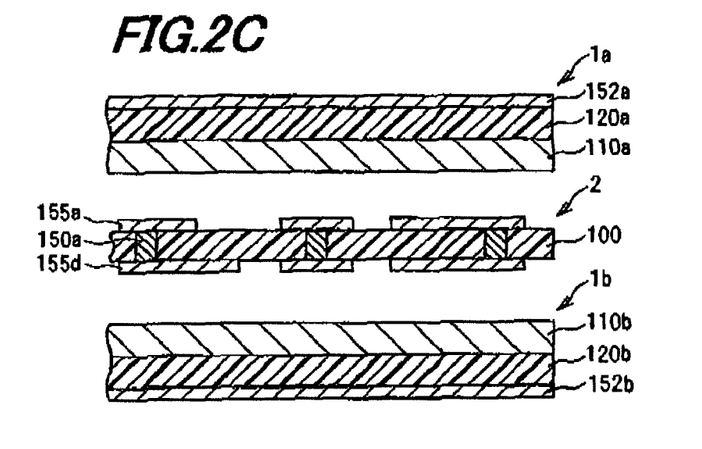
FIG. 2C is a longitudinal sectional view showing arrangement of the two laminate plates and the two-layer wiring board in the embodiment.

FIG. 2A is a longitudinal sectional view showing a laminate plate in the embodiment. FIG. 2B is a longitudinal sectional view showing a two-layer wiring board in the embodiment. FIG. 2C is a longitudinal sectional view showing arrangement of the two laminate plates and the two-layer wiring board in the embodiment.

Firstly, as shown in FIG. 2A, a laminate plate 1a is formed. Specifically, the second insulating layer 120a is bonded to the surface of the first insulating layer 110a. Furthermore, the laminate plate 1a is formed by bonding a metal layer 152a to the surface of the second insulating layer 120a (laminate plate formation step). Here, the metal layer 152a is, for example, copper foil. In this embodiment, a laminate plate 1b which has the same structure as the laminate plate 1a is also formed.

Next, as shown in FIG. 2B, the wiring pattern 155d is formed by etching etc. after bonding the copper foil to one surface of the core insulating layer 100. Then, plural blind via holes are formed by laser processing in a predetermined region of the core insulating layer 100. Next, copper is filled in the formed blind via holes by copper plating. Following this, after bonding the copper foil to the opposite side of the surface where the wiring pattern 155d of the core insulating layer 100 is formed, a two-layer wiring board 2 is formed by forming the wiring pattern 155a by etching etc. (core insulating layer formation step).

It is also possible to form the two-layer wiring board 2 as below. Namely, firstly, the copper foil is bonded to both sides of the core insulating layer 100. Then, plural via holes are formed by using a drill or a laser in a predetermined region of the core insulating layer 100 to where the copper foil has been bonded. Following this, it is also possible to form the two-layer wiring board 2 by filling the copper in the formed via holes by copper plating.

Then, as shown in FIG. 2C, while the first insulating layer 110a of the laminate plate 1a is arranged so as to locate on one side of the two-layer wiring board 2, the first insulating layer 110b of the laminate plate 1b is arranged so as to locate on another side of the two-layer wiring board 2.

Figure 2D:
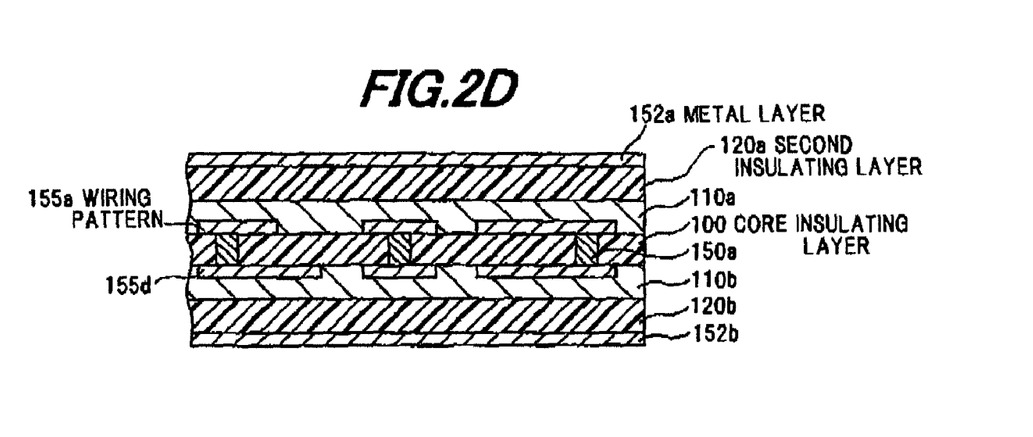
FIG. 2D is a longitudinal sectional view showing a laminate structure as a composite substrate in the embodiment.
Figure 2E:
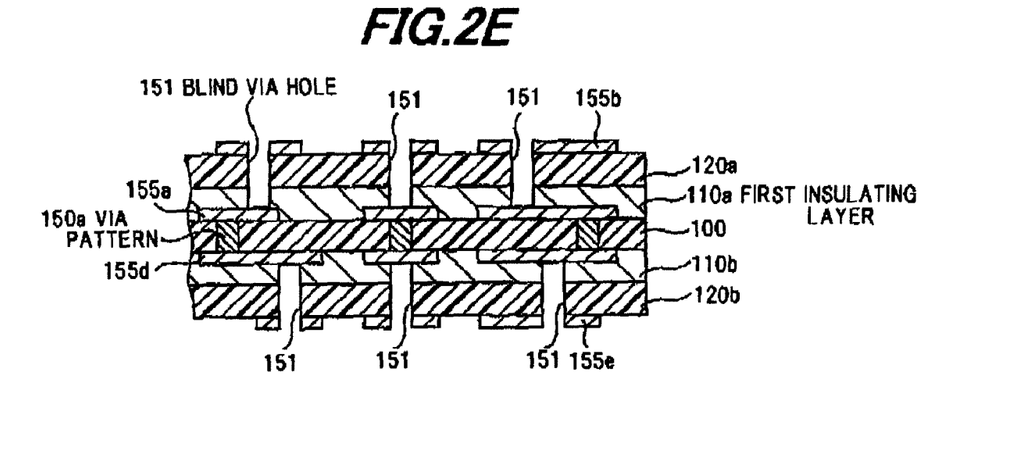
FIG. 2E is a longitudinal sectional view showing the laminate structure with blind via holes formed therein in the embodiment.
Figure 2F:
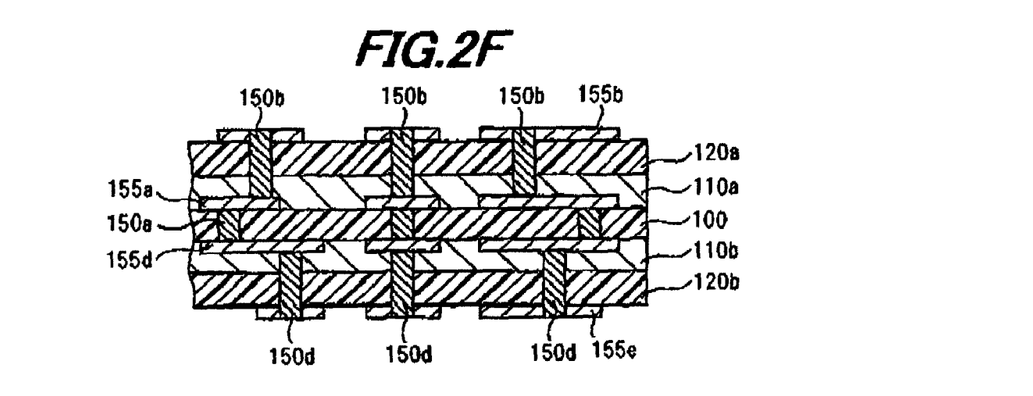
FIG. 2F is a longitudinal sectional view showing the laminate structure with via patterns formed in the via holes in the embodiment.

FIG. 2D is a longitudinal sectional view showing a laminate structure as a composite substrate in the embodiment. FIG. 2E is a longitudinal sectional view showing the laminate structure with blind via holes formed therein in the embodiment. FIG. 2F is a longitudinal sectional view showing the laminate structure with via patterns formed in the via holes in the embodiment.

As shown in FIG. 2D, laminating or hot press bonding is conducted for one minute in vacuum atmosphere at 260° C. and at pressure of 1 MPa in the state that the two-layer wiring board 2 is sandwiched between the laminate plates 1a and 1b. As a result, a laminate structure as a composite substrate in which the two-layer wiring board 2 is disposed between the laminate plates 1a and 1b is formed (bonding step).

In this embodiment, the first insulating layers 110a and 110b are a liquid crystal polymer having a liquid crystal transition temperature as a softening temperature which is lower than the material to form the core insulating layer 100. And the first insulating layers 110a and 110b have a role as an adhesion layer to fix the second insulating layers 120a and 120b to the core insulating layer 100.

Here, the first insulating layer 110a of the laminate plate 1a and the first insulating layer 110b of the laminate plate 1b adhere tightly to the surface of the core insulating layer 100 of the two-layer wiring board 2 and the wiring patterns 155a and 155d. Therefore, at the time of laminating or hot press bonding, the first insulating layer 110a strongly adhere to the surface of the core insulating layer 100 and that of the wiring pattern 155a.

Namely, the case that a wiring pattern is preliminarily formed on the surface of the first insulating layer 110a is considered tentatively. In this case, even if reaching the softening temperature during laminating or hot press bonding, since the surface of the first insulating layer 110a in the region where the wiring pattern is preliminarily formed is covered by the wiring pattern, there is no influence on the improvement of bond strength between the core insulating layer 100 and the laminate plate 1a.

Meanwhile, in this embodiment, when reaching the softening temperature of the first insulating layer 110a during laminating or hot press bonding, the region on the surface of the first insulating layer 110a which contacts with the core insulating layer 100 is integrated with the core insulating layer 100, while the region on the surface of the first insulating layer 110a which contacts with the wiring pattern 155a adheres tightly to the surface of the wiring pattern 155a. Therefore, the whole surface of the first insulating layer 110a in this embodiment contributes to the improvement of bond strength of the core insulating layer 100 and the laminate plate 1a. For the laminate plate 1b, similarly to the laminate plate 1a, the whole surface of the first insulating layer 110b contributes to the improvement of bond strength of the core insulating layer 100 and the laminate plate 1b.

Next, as shown in FIG. 2E, metal layers 152a and 152b are etch processed so that a predetermined region of the metal layers 152a and 152b remain as the wiring patterns 155b and 155e. Furthermore, blind via holes 151 as plural throughholes to expose the wiring pattern 155a penetrating through the wiring pattern 155b, the second insulating layer 120a and the first insulating layer 110a by using a laser, are formed (a through-hole formation step). In the same way, plural blind via holes 151 to expose the wiring pattern 155d penetrating through the wiring pattern 155e, the second insulating layer 120b and the first insulating layer 110b are formed.

Following this, as shown in FIG. 2F, a laminate structure which has the via patterns 150b and 150d formed by plating copper in the blind via holes 151 formed in the above FIG. 2E is formed. As a result, the wiring patterns 155a and 155b are electrically connected by the via pattern 150b formed of copper as a conductive material (connecting step). In the same way, the wiring patterns 155d and 155e are electrically connected by the via pattern 150d.

Figure 2G:
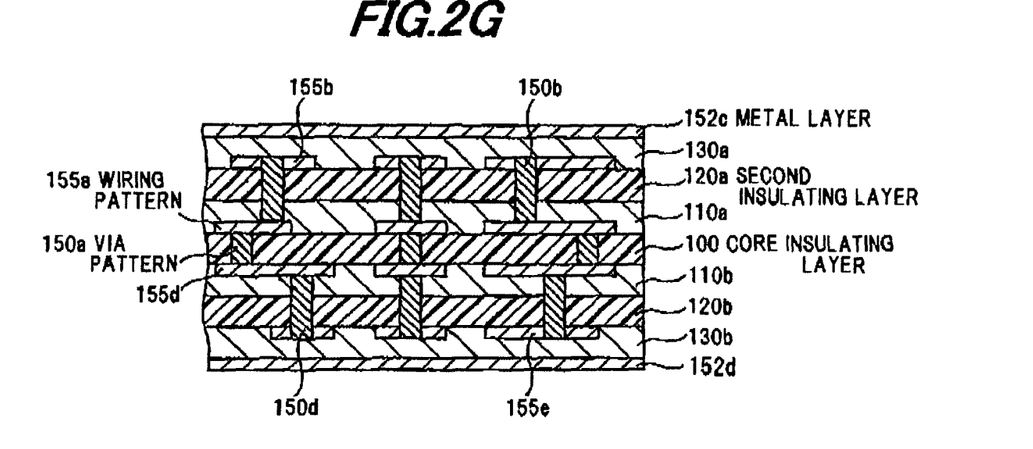
FIG. 2G is a longitudinal sectional view showing the laminate structure in FIG. 2F with an outmost insulating layer and a metal layer bonded thereto in the embodiment.
Figure 2H:
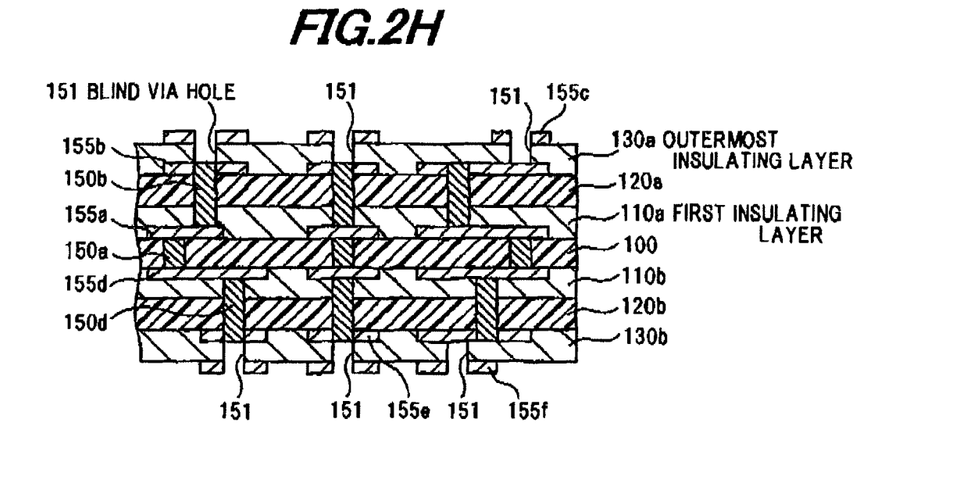
FIG. 2H is a longitudinal sectional view showing the laminate structure in FIG. 2G with blind via holes formed therein in the embodiment.

FIG. 2G is a longitudinal sectional view showing the laminate structure in FIG. 2F with an outmost insulating layer and a metal layer bonded thereto in the embodiment. FIG. 2H is a longitudinal sectional view showing the laminate structure in FIG. 2G with blind via holes formed therein in the embodiment.

As shown in FIG. 2G, the outmost insulating layer 130a on which the metal layer 152c is bonded is disposed on the second insulating layer 120a so that a metal layer 152c is exposed outside. In the same way, the outmost insulating layer 130b on which a metal layer 152d is bonded is disposed on the second insulating layer 120b so that the metal layer 152d is exposed outside.

Then, laminating or hot press bonding is conducted for one minute in vacuum atmosphere at 260° C. and at pressure of 1 MPa in the state that the laminate structure obtained by the process of the above-mentioned FIG. 2F is sandwiched between the outmost insulating layers 130a and 130b. As a result, the structure in which the laminate structure obtained by the process of the above-mentioned FIG. 2F is disposed between the outmost insulating layers 130a and 130b, is formed.

Next, as shown in FIG. 2H, the metal layers 152c and 152d are etch processed so that a predetermined region of the metal layers 152c and 152d remain as the wiring patterns 155c and 155f. Furthermore, plural blind via holes 151 to expose the wiring pattern 155b penetrating through the wiring pattern 155c and the outmost insulating layer 130a by using a laser, are formed. In the same way, plural blind via holes 151 to expose the wiring pattern 155e penetrating through the wiring pattern 155f and the outmost insulating layer 130b are formed.

Figure 2I:
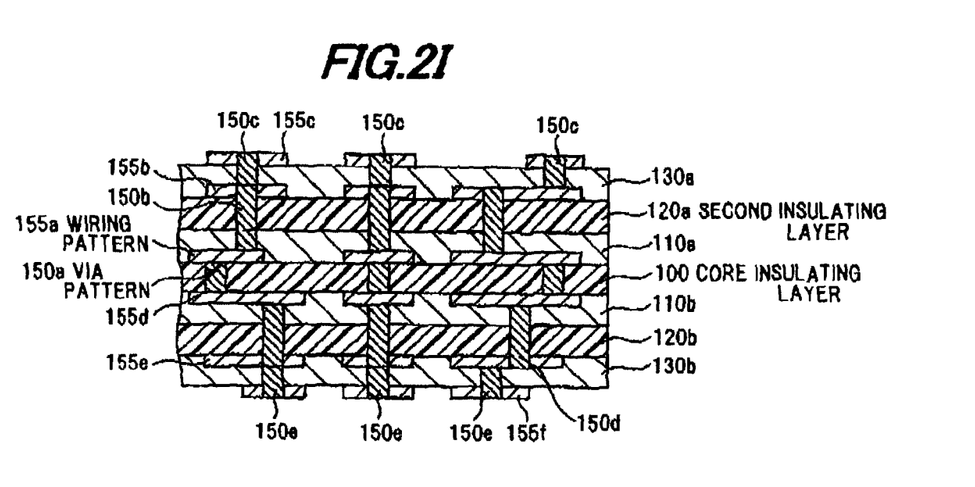
FIG. 2I is a longitudinal sectional view showing the laminate structure in FIG. 2H with via patterns formed in the blind via holes in the embodiment.
Figure 2J:
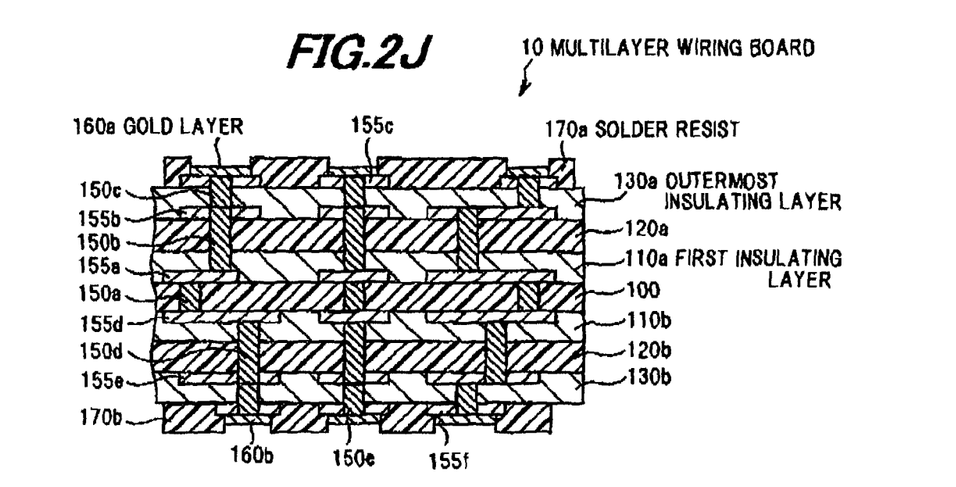
FIG. 2J is a longitudinal sectional view showing the multilayer wiring board thus fabricated in the embodiment.

FIG. 2I is a longitudinal sectional view showing the laminate structure in FIG. 2H with via patterns formed in the blind via holes in the embodiment. FIG. 2J is a longitudinal sectional view showing the multilayer wiring board thus fabricated in the embodiment.

As shown in FIG. 2I, a laminate structure which has the via patterns 150c and 150e formed by plating copper in blind via holes 151 in the above FIG. 2H is formed. As a result, the wiring patterns 155b and 155c are electrically connected by the via pattern 150c. In the same way, the wiring patterns 155e and 155f are electrically connected by the via pattern 150e.

Following this, as shown in FIG. 2J, the solder resists 170a and 170b are each formed in a predetermined region including an outer edge of the outmost insulating layer 130a and the wiring pattern 155c and that of the outmost insulating layer 130b and the wiring pattern 155f. Then, the metal layer 160a is formed in a region where the solder resist 170a on the wiring pattern 155c and the via pattern 150c is not formed. In the same way, the metal layer 160b is formed in a region where the solder resist 170b on the wiring pattern 155f and the via pattern 150e is not formed. It is possible to form the metal layers 160a and 160b by, for example, gold plating. As a result, the multilayer wiring board 10 in this embodiment is formed.

Figure 3A:
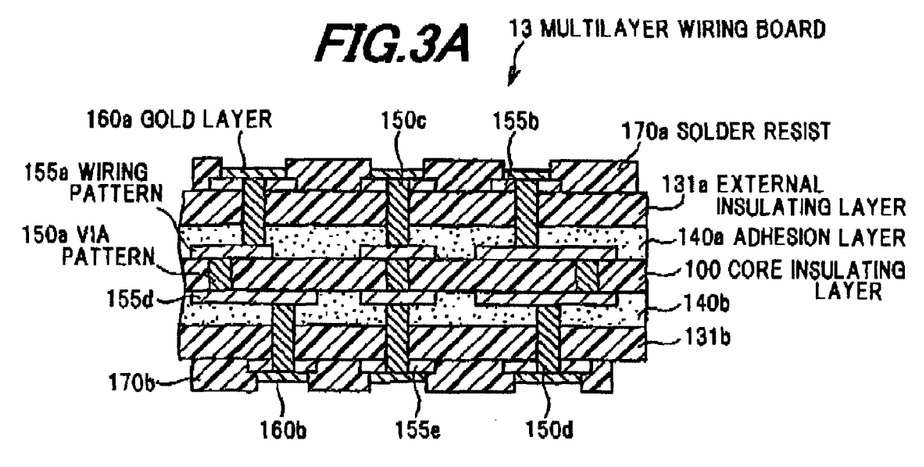
FIG. 3A is a longitudinal sectional view showing a multilayer wiring board in a comparative example.
Figure 3B:
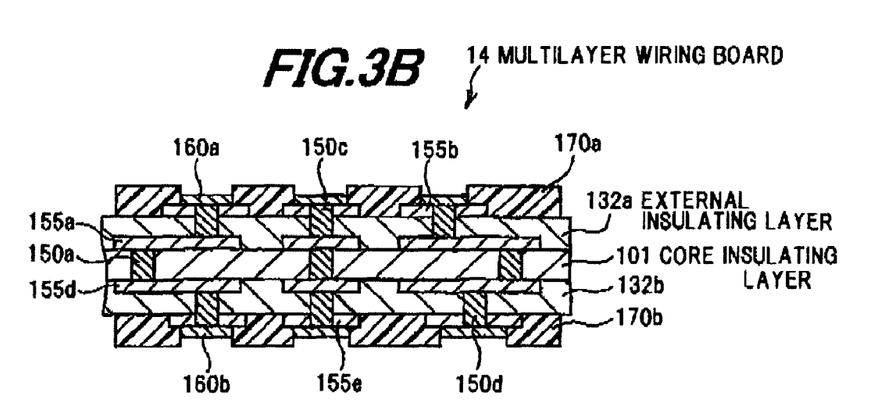
FIG. 3B is a longitudinal sectional view showing a multilayer wiring board in another comparative example.

FIG. 3A is a longitudinal sectional view showing a multilayer wiring board in a comparative example. FIG. 3B is a longitudinal sectional view showing a multilayer wiring board in another comparative example.

In FIG. 3A and FIG. 3B, like components are indicated by the same numerals as used in FIG. 1 to FIG. 2J have substantially the same effects and functions as components of the multilayer wiring board 10 in FIG. 1 to FIG. 2J. Therefore, detailed explanations thereof are omitted below.

FIG. 3A is a longitudinal sectional view showing a multilayer wiring board 13, wherein the first insulating layers 110a and 110b of the multilayer wiring board 10 in this embodiment are replaced with adhesion layers 140a and 140b, respectively, and there are not outmost insulating layers 130a and 130b. External insulating layers 131a and 131b of the multilayer wiring board 13 in the comparative example are formed of the same material as the second insulating layers 120a and 120b in this embodiment.

In the multilayer wiring board 13 in the comparative example of FIG. 3A, the external insulating layers 131a and 131b are bonded to the core insulating layer 100 by the adhesion layers 140a and 140b, respectively. In this comparative example, the adhesion layers 140a and 140b are formed of, for example, an epoxy resin or an acrylic resin etc. as a thermosetting adhesive, or, a polyimide resin etc. as a thermoplastic adhesive.

When bonding the external insulating layers 131a and 131b to the core insulating layer 100 using the adhesion layers 140a and 140b, the heat treatment process to apply pressure at 2 MPa for about one hour at 180° C. must be conducted in the state that the external insulating layer 131a, the adhesion layer 140a, the core insulating layer 100, the adhesion layer 140b and the external insulating layer 131b are laminated in this order. Since the adhesion layers 140a and 140b are an epoxy resin or an acrylic resin or the like, it takes long time for the heat treatment process as thermosetting time.

Meanwhile, in the multilayer wiring board 10 in this embodiment, the first insulating layers 110a and 110b which correspond to the adhesion layers 140a and 140b in the comparative example of FIG. 3A are formed of a thermoplastic liquid crystal polymer. Then, the core insulating layer 100 in this embodiment is formed of a polyimide resin or a bismaleimide triazine resin. The liquid crystal transition temperature as a softening temperature of the liquid crystal polymer is about 260° C. and the glass transition temperature as a softening temperature of the polyimide resin or the bismaleimide triazine resin is 300° C. or more.

Namely, since the difference between the softening temperature of the liquid crystal polymer and that of the polyimide resin or the bismaleimide triazine resin in this embodiment is large such as 40° C. or more, it is possible to bond the core insulating layer 100 to the second insulating layers 120a and 120b via the first insulating layers 110a and 110b at a temperature in which the core insulating layer 100 is not softened.

Then, in this embodiment, since the liquid crystal polymer which softens at a temperature higher than the thermosetting epoxy resin or acrylic resin requiring more than about one hour of thermosetting time is used for the first insulating layers 110a and 110b having a function to adhere the core insulating layer 100 and the second insulating layers 120a and 120b, it is possible to bond the core insulating layer 100 to the second insulating layers 120a and 120b at higher temperature and for shorter time (for example, one minute) compared with the comparative example of FIG. 3A based on the melting temperature difference of these materials.

There are thermosetting polyimide resin and thermoplastic polyimide resin. For example, when the thermosetting polyimide resin is used as the first insulating layers 110a and 110b described in this embodiment, there is a problem such that moisture is generated inside and becomes air bubbles by a chemical reaction due to imidization of high-temperature treatment in the thermosetting process. Meanwhile, when the thermoplastic polyimide resin which solves those problems is used as the first insulating layers 110a and 110b described in this embodiment, although the heat treatment period is short such as within one minute, the heat treatment temperature becomes high such as about 350° C. to 400° C. Furthermore, although epoxy resins are often used when using the thermosetting resin as an adhesive, when using thermosetting epoxy resins as the first insulating layers 110a and 110b described in this embodiment, the heat treatment temperature becomes low such as 180° C., however, it takes about one hour for the heat treatment period for a curing reaction.

For this reason, the above-mentioned adhesion using the liquid crystal polymer is effective to form the laminate structure of the multilayer wiring board at low temperature and for a short time. Furthermore, it is desirable from the point of view that there is little influence of heat contraction by not exceeding the glass transition temperature of the insulating layer consisting of a polyimide resin.

Furthermore, a linear thermal expansion coefficient of the liquid crystal polymer forming the first insulating layers 110a and 110b of the multilayer wiring board 10 in this embodiment is smaller compared with that of the thermosetting adhesion layer used for the comparative example of FIG. 3A. Therefore, in the multilayer wiring board 10 in this embodiment, heat expansion and contraction during the heat treatment process is smaller than the multilayer wiring board 13 in comparative example of FIG. 3A.

Furthermore, in the multilayer wiring board 13 in comparative example of FIG. 3A, the external insulating layers 131a and 131b contacting outside are each formed of a polyimide resin. Since the polyimide resin has a high water-absorbing ratio, foam formation and a separation phenomenon of the solder resists 170a and 170b occur by evaporation of the moisture which is absorbed by the polyimide resin during the heat treatment process.

Meanwhile, according to the multilayer wiring board 10 in this embodiment, the outmost insulating layers 130a and 130b contacting outside are each formed of a liquid crystal polymer. Since the water-absorbing ratio of the liquid crystal polymer is lower than that of the polyimide, it is possible to control the evaporation of the moisture which is absorbed by the polyimide resin during the heat treatment process. Therefore, according to the multilayer wiring board 10 in this embodiment, it is possible to control the foam formation and the separation phenomenon of the solder resists 170a and 170b.

Furthermore, FIG. 3B is a longitudinal sectional view showing a multilayer wiring board 14, wherein the first insulating layers 110a and 110b of the multilayer wiring board 10 in this embodiment are replaced with external insulating layers 132a and 132b, respectively, and there are not outmost insulating layers 130a and 130b. The external insulating layers 132a and 132b of the multilayer wiring board 14 in this comparative example are each formed of the same material as the first insulating layers 110a and 110b in this embodiment.

A core insulating layer 101 and the external insulating layers 132a and 132b in the comparative example of FIG. 3B are each formed of the same material, for example, formed of a liquid crystal polymer. Therefore, since the respective softening temperature of the core insulating layer 101 and the external insulating layers 132a and 132b are same, no difference between the softening temperature of the core insulating layer 101 and that of the external insulating layers 132a and 132b occurs. Therefore, when bonding the external insulating layers 132a and 132b to the core insulating layer 101, it takes about one hour for the heat treatment process.

Meanwhile, when making the multilayer wiring board 10 in this embodiment, the core insulating layer 100 is formed of a polyimide resin or a bismaleimide triazine resin, and the first insulating layers 110a and 110b which bond the second insulating layers 120a and 120b to the core insulating layer 100 are formed of a liquid crystal polymer.

Here, since the difference between the softening temperature of the liquid crystal polymer and that of the polyimide resin or the bismaleimide triazine resin in this embodiment is large such as 40° C. or more, it is possible to bond the core insulating layer 100 to the second insulating layers 120a and 120b via the first insulating layers 110a and 110b at a temperature in which the core insulating layer 100 is not softened and for a shorter time compared with the case to form the multilayer wiring board 14 in the comparative example shown in FIG. 3B.

In addition, it is also possible to form the multilayer wiring board 10 having excellent high frequency characteristics by using materials having excellent electrical characteristics for the material to form the core insulating layer 100, the first insulating layer 110a, the second insulating layer 120a, the outmost insulating layer 130a, the first insulating layer 110b, the second insulating layer 120b and the outmost insulating layer 130b composing the multilayer wiring board 10 in this embodiment.

EFFECTS OF THE EMBODIMENT

According to this embodiment, it is possible to bond the core insulating layer 100 to the second insulating layers 120a and 120b using the first insulating layers 110a and 110b formed of a liquid crystal polymer having excellent hygroscopic characteristics. As a result, it is possible to provide a multilayer wiring board 10 having a low water-absorbing ratio in whole by taking advantage of the low water-absorbing ratio of the liquid crystal polymer, while taking advantage of heat resistance properties, electrical characteristics and mechanical characteristics of the polyimide resin which forms the core insulating layer 100.

Furthermore, according to this embodiment, since there is not a thermosetting adhesion layer sowing a linear expansion coefficient larger than that of the core insulating layer 100 and the second insulating layers 120a and 120b, it is possible to provide a multilayer wiring board 10 in which the heat expansion and contraction in longitudinal and lateral directions of the multilayer wiring board 10 is reduced compared with the case having a thermosetting adhesion layer. According to the multilayer wiring board 10 in this embodiment of which a degree of heat expansion and contraction is small, for example, when mounting an electronic component such as LSI on the multilayer wiring board 10 using a lead-free soldering, it is possible to reduce heat stress which is generated during the mounting process of the electronic component (for example, during reflow process) compared with the multilayer wiring board using a thermosetting adhesion layer.

Furthermore, according to the method for making the multilayer wiring board 10 in this embodiment, since there is a large difference between the softening temperature of the core insulating layer 100 and that of the first insulating layer which adheres the core insulating layer 100 and the second insulating layer 120, it is possible to form the multilayer wiring board 10 by a brief lamination or hot pressing process.

Modifications

Figure 4A:
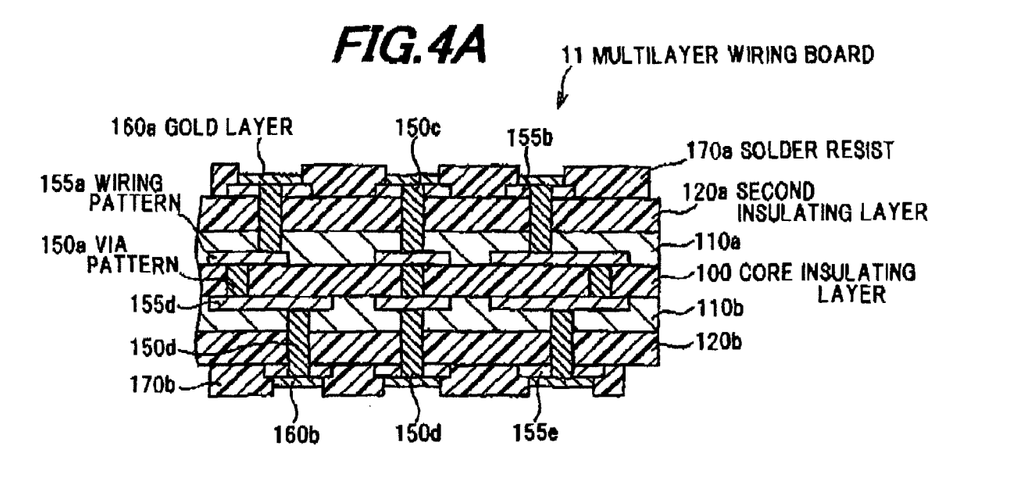
FIG. 4A is a longitudinal sectional view showing a multilayer wiring board in a modification of the embodiment.
Figure 4B:
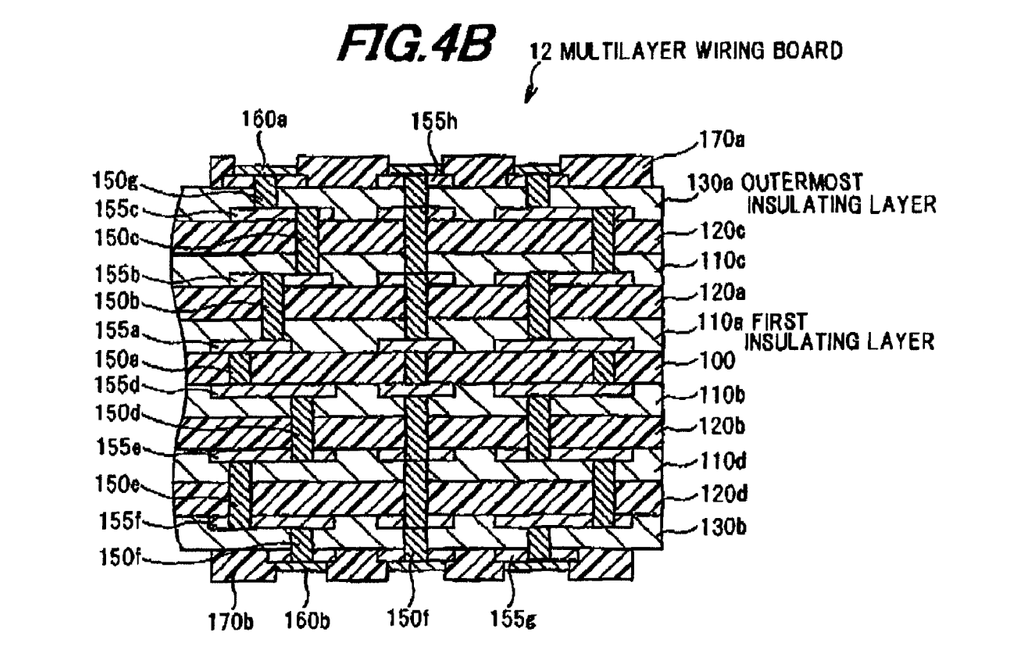
FIG. 4B is a longitudinal sectional view showing a multilayer wiring board in another modification of the embodiment.

FIG. 4A is a longitudinal sectional view showing a multilayer wiring board in a modification of the embodiment. FIG. 4B is a longitudinal sectional view showing a multilayer wiring board in another modification of the embodiment.

The multilayer wiring board 11 shown in FIG. 4A comprises the same structure as the multilayer wiring board 10 except the point that the outmost insulating layers 130a and 130b are removed from the multilayer wiring board 10. Namely, the multilayer wiring board 11 is formed by disposing the second insulating layers 120a and 120b at a portion to contact outside.

A multilayer wiring board 12 shown by FIG. 4B has a structure that a first insulating layer 110c and a second insulating layer 120c are formed between the outmost insulating layer 130a and the second insulating layer 120a of the multilayer wiring board 10 in this embodiment, and a first insulating layer 110d and a second insulating layer 120d are further formed between the outmost insulating layer 130b and the second insulating layer 120b. From this structure, it is possible to further provide a multilayer wiring board 12 having plural wiring patterns 155c and 155f inside.

In addition, it is possible to construct a further multilayered multilayer wiring board by forming plural paired laminates composed of the first insulating layer 110c and the second insulating layer 120c between the outmost insulating layer 130a and the second insulating layer 120a, and by further forming plural paired laminates composed of the first insulating layer 110d and the second insulating layer 120d between the outmost insulating layer 130b and the second insulating layer 120b.

Although the invention has been described, the invention according to claims is not to be limited by the above-mentioned embodiments. It should be noted that all combinations of the features described in the embodiment are not always needed to solve the problem of the invention.

What is claimed is:

1. A multilayer wiring board comprising:
   a core insulating layer comprising a thermosetting resin and a first conductive wiring,
   a first insulating layer comprising a thermoplastic liquid crystal polymer having a softening temperature lower than the core insulating layer, the first insulating layer being laminated on and contacting a surface of the first conductive wiring and a surface of the core insulating layer;
   a second insulating layer laminated on and contacting a surface of the first insulating layer, the second insulating layer comprising a second conductive wiring electrically connected to the first conductive wiring and further comprising a thermosetting resin having a softening temperature higher than the first insulating layer;
   an outmost insulating layer laminated on and contacting a surface of the second conductive wiring and a surface of the second insulating layer, the outmost insulating layer comprising a wiring pattern electrically connected to the first conductive wiring and electrically connected to the second conductive wiring; and
   a solder resist provided along an outer edge of the wiring pattern and provided along an outer edge of the outmost insulating layer,
   wherein the outmost insulating layer comprises a material which is the same as a material of the first insulating layer and further comprises a water-absorbing ratio lower than a water-absorbing ratio of the core insulating layer and lower than a water-absorbing ratio of the second insulating layer.

2. The multilayer wiring board according to claim 1, wherein the core insulating layer and the second insulating layer comprise a polyimide resin or a bismaleimide triazine resin.

3. The multilayer wiring board according to claim 1, wherein the first conductive wiring and the second conductive wiring are electrically connected through a conductive via formed penetrating through the first insulating layer and the second insulating layer in a thickness direction.

4. The multilayer wiring board according to claim 1, wherein the outmost insulating layer is provided on the second insulating layer opposite the first insulating layer.

5. The multilayer wiring board according to claim 1, wherein a linear expansion coefficient of the first insulating layer is smaller than a linear thermal expansion coefficient of the core insulating layer and smaller than a linear thermal expansion coefficient of the second insulating layer.

* * * * *